United States Patent [19]

Lockhart, Jr. et al.

[11] 3,912,984

[45] Oct. 14, 1975

[54] AUXILIARY CIRCUIT PACKAGE

[75] Inventors: James A. Lockhart, Jr., Basking Ridge, N.J.; David Durney, Holland, Pa.

[73] Assignee: Burroughs Corporation, Detroit, Mich.

[22] Filed: Feb. 13, 1975

[21] Appl. No.: 549,524

Related U.S. Application Data

[62] Division of Ser. No. 431,063, Jan. 7, 1974, abandoned.

[52] U.S. Cl......... 317/101 CC; 29/591; 174/DIG. 3; 339/17 CF; 357/74

[51] Int. Cl.²........................................... H05K 1/18

[58] Field of Search............ 174/52 R, 68.5, DIG. 3; 317/101 CC, 101 C, 101 D; 339/17 C, 17 CF, 75 R; 357/74; 29/591

[56] References Cited

UNITED STATES PATENTS

| | | | |
|---|---|---|---|
| 2,974,258 | 3/1961 | Garthwaite | 317/101 CC |
| 3,164,750 | 1/1965 | Miller | 339/17 CF |
| 3,353,139 | 11/1967 | Ribbelink | 317/101 CC X |
| 3,673,551 | 6/1972 | McDonough | 339/17 CF X |

*Primary Examiner*—Darrell L. Clay

*Attorney, Agent, or Firm*—G. Gregory Schivley; Kevin R. Peterson

[57] ABSTRACT

An auxiliary circuit package is disclosed which is intended for use in an electrical socket formed of free standing terminals. When in use, the body portion of the package depends from its electrical contact members between the free standing socket terminals. A second electrical package, for example, a dual-in-line, can be simultaneously located in contact with the same free standing terminals. The package can contain active or passive devices.

6 Claims, 2 Drawing Figures

AUXILIARY CIRCUIT PACKAGE

CROSS REFERENCE TO RELATED APPLICATION

This is a division of application Ser. No. 431,063, filed Jan. 7, 1974, now abandoned, entitled "Auxiliary Circuit Package" having the same inventors and assignee as the present invention.

BACKGROUND OF THE INVENTION

1. Field of the Invention

The present invention relates to a low profile package which can be used to contain active or passive circuit elements. The package is primarily intended for use in a socket made of free standing terminals which can be simultaneously occupied by a second package containing an integrated circuit.

2. Description of the Prior Art

In the design and implementation of a complex electronic circuit, it is the usual practice to lay out the entire circuit and then partition the circuit into circuit modules which can be incorporated into separate packages. A printed circuit board is then designed and fitted with sockets to connect the individual packages to form the overall circuit. It is not uncommon to find, after the printed circuit board has been designed and the circuit modules have been made, that one or two additional components or minor circuit modules are necessary to gain the full operating efficiency of the circuit. Since the circuit is usually designed to be assembled by automatic loading equipment, the necessity of having to add additional components complicates the final assembly. It is usually too time consuming and expensive to redesign the printed circuit board. It therefore becomes necessary to use hand labor to add the additional components which substantially increases the time necessary to assemble the printed circuit board and also the expense of manufacturing the board.

As pointed out above, it has been conventional practice to build up a complex electronic circuit by using separate circuit modules which are plugged into sockets mounted on a printed circuit board. It is not uncommon in the final testing of such a circuit or to observe in the operation of the circuit at its field location that additional components, such as bypass capacitors or swamping resistors, are needed for the circuit to operate efficiently. Since printed circuit boards tend to be designed in a compact manner, it is difficult to add an additional component not provided for in the original circuit design. Often it was found necessary to mount the passive components on the opposite side of the printed circuit board where they then tended to interfere with the mounting of the board in close proximity to other circuit boards. An alternative procedure was to mount the components adjacent to the socket. The latter technique was also undesirable in that it was necessary to use long leads on the component to reach suitable attachment points on the printed circuit board. These components then tend to interfere with the placement of the plug-in modules and also tend to increase the incidence of short circuits between circuit modules.

Each of the above problems, whether encountered in the factory or in the field, has to be cured through the use of hand labor, which is time consuming and therefore expensive. Also, each of the additional components must be soldered into the circuit which presents a serious hazard to the printed circuit board and to the components and circuit packages mounted on the board due to excessive heating and solder bridging.

In order to overcome each of the abovementioned difficulties, it would be desirable to provide the circuit designer or field service technician with a means for quickly and inexpensively adding additional components to a printed circuit board.

SUMMARY OF THE INVENTION

Accordingly, it is an object of the present invention to provide the circuit designer and field service technician with an auxiliary circuit package which can be added to a printed circuit board by automatic handling equipment or by hand with a minimum amount of effort and without the necessity of soldering.

The package of the present invention is primarily intended for use in combination with an electrical socket made up of free standing terminal members. The package is designed to occupy the open space between the rows of free standing terminals. When in use, the package presents a very low profile reducing the overall thickness of a circuit module. Since the package occupys the region between the free standing terminals, an additional package can be mounted in the same free standing terminals. The package is primarily intended to contain passive circuit elements, such as capacitors and resistors, but also can be used with active circuit elements and even integrated circuits. The package of the present invention provides a convenient means of adding bypass and decoupling capacitors in the immediate proximity of the active circuit elements contained in the package plugged over the auxiliary package.

DESCRIPTION OF THE PREFERRED EMBODIMENTS

Figures 1, 2:
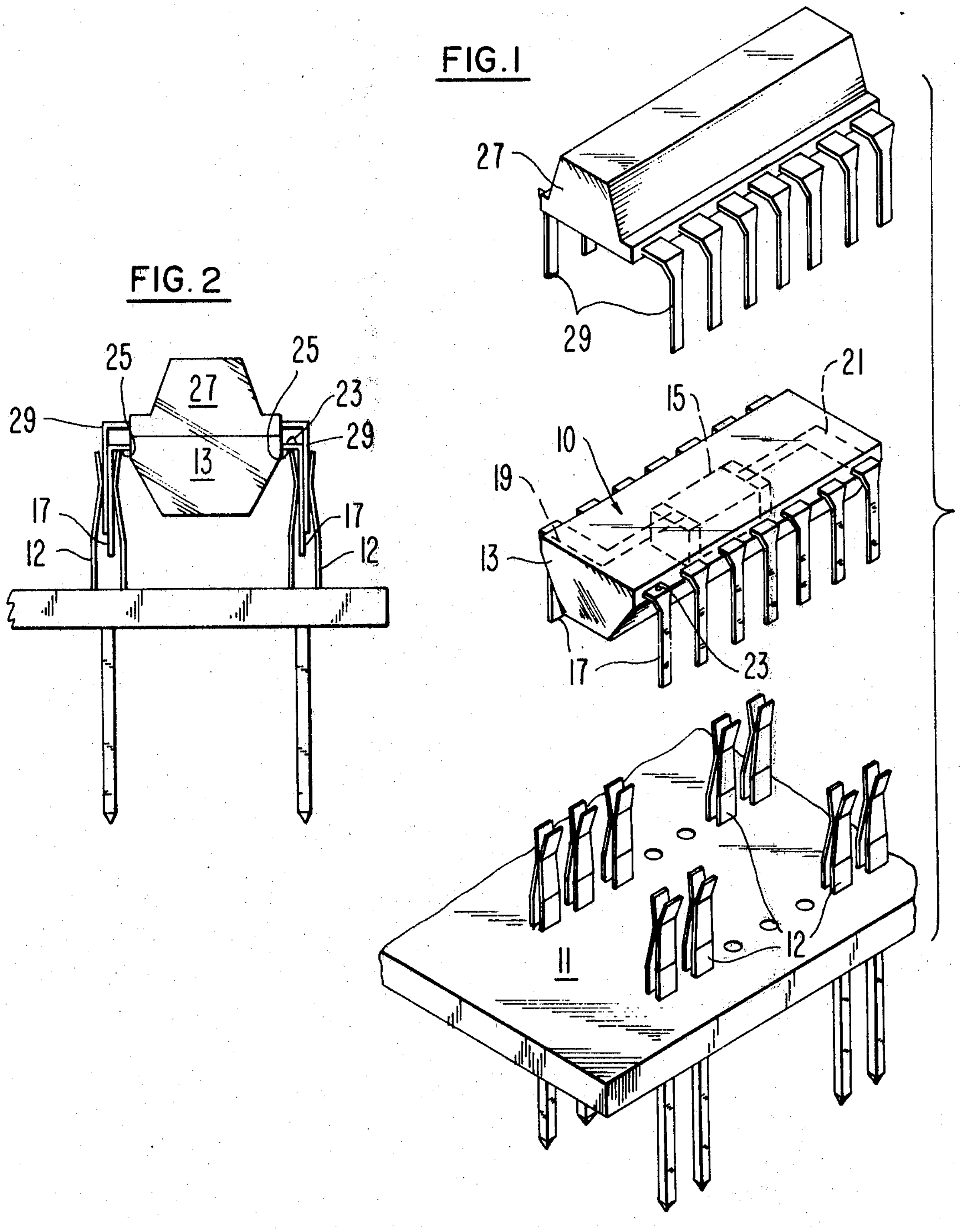
FIG. 1 is an exploded perspective view of the auxiliary circuit package of the present invention shown with a socket formed of free standing terminals and with a dual-in-line package.
FIG. 2 is an end elevational view of the auxiliary circuit package shown mounted in a socket formed of free standing terminals and with a dual-in-line package mounted in the same socket.

In contrast to the conventional socket which has a plastic body which unites several metal sockets into an assembly, the socket formed of free standing terminals is merely an association of individual terminal members. The U.S. patent to V. J. Palacheck, U.S. Pat. No. 3,768,068, issued Oct. 23, 1973, and assigned to Bunker Ramo Corporation discloses and claims a representative free standing terminal. The terminal is intended to be automatically inserted into a printed circuit board. One end of the terminal has a throat for receiving a contact member while the opposite end is adapted to receive and support a wire wrap connection. Several of the free standing terminals are associated together on a printed circuit board, for example, two spaced parallel groups of 14 or 28 can be used to hold a conventional dual-in-line package. When the free standing terminals are associated together to form a socket, the area between the terminals is open. The auxiliary circuit package of the present invention is primarily intended to fit within this open area.

The auxiliary circuit package 10 of the present invention is shown in FIG. 1 in association with a socket 11 formed of free standing terminals 12. The package 10 has a body 13 which supports an electrical component 15, shown in phantom. The component 15 is electrically connected to an effective number of the contact members 17 by leads 19 and 21, also shown in phantom.

As shown in FIGS. 1 and 2, the contact members 17 are substantially identical in configuration and are fixed in a substantially spaced parallel relationship along opposite side portions of the body 13. For convenience in mounting the auxiliary circuit package, one or more of the contact members 17 can be equipped with identification or polarizing means 23. The identification means can also be stamped or printed on the body member 13.

The contact members 17 are fixed near the upper portion of body member 13 so that a substantial portion of the body member depends below the point where the contact members 17 join the body member 13. Also, the major portion of the body member 13 is bounded on either side by the contact members 17. While the preferred embodiment of the auxiliary circuit package is shown having contact members along only two sides, the present invention also contemplates body members and sockets of other configurations such as circular or square.

Referring to FIGS. 1 and 2, the contact members 17 are shown projecting from either side of the body 13. The contact members are then bent downwardly so that the end portions of the contact members will align with the free standing terminals forming the socket 11. The horizontal portions 25 of the contact members 17 provide an abutment upon which the auxiliary circuit package can rest when in position in the socket 11. The contact members 17 project into the body member 13 and provide internal portions for electrical connection to the leads 19 and 21 and in turn the component 15.

Any suitable electrically conducting material can be used for contact members 17 so long as it has sufficient mechanical strength to support the body member 13 and overcome the contact resistance of the socket 11. Preferred materials are copper alloys which can be gold plated completely or just in selected portions.

The body member 13 can be of any suitable configuration. As seen in FIGS. 1 and 2, it is substantially rectangular to correspond to the configuration of the socket 11 and the dual-in-line package 27 with which it is to be used. The body member 13 can be made of any suitable material such as plastic, glass, or ceramic, the choice of material being determined by the type of component to be used, the conditions under which the circuit is to operate and cost considerations.

The auxiliary circuit package 10 can be manufactured by techniques well known in the electrical packaging arts. For example, a conventional metal lead frame can be attached to a ceramic body. The electrical circuit component can then be mounted in the ceramic body and attached to the lead frame. The ceramic body is then covered with a cap or filled with a suitable filler material. The package is then fired to form an integral body member. The lead frame can then be shaped and trimmed to finish the package.

When a plastic package is desired, a conventional metal lead frame can again be used. The component can be attached to an effective number of the contact members. The assembly of lead frame component can then be placed in an injection molding machine and plastic material can be injected to form the body. The lead frame is again bent and trimmed to complete the package as previously discussed.

The auxiliary circuit package of the present invention can be used to support both active and passive components. The packages can be handled in automatic loading equipment for those applications when a component must be added to a newly designed circuit. The packages can also be used by the field service technician to add components to printed circuit boards with a minimum amount of effort and without the need to solder the component in place. A set of the auxiliary circuit packages can be used by the service technician to test components in a circuit until the optimum component value is determined. The components can be added and removed quickly and without the need to solder and unsolder the components with the continual hazard of damaging an expensive printed circuit board. As shown in FIG. 2, the contact members 17 fit within the free standing terminals 12 along with the contacts 29 from the dual-in-line package 27. The compressive force on the combined terminals is sufficient to provide proper electrical connection.

While a particular embodiment of the invention has been shown, it will be understood, of course, that it is not desired that the invention be limited thereto since modifications may be made, and it is, therefore, contemplated by the appended claims to cover any such modifications as fall within the true spirit and scope of the invention.

What is claimed is:

1. An electrical circuit assembly comprising:

a primary circuit package having a body member with spaced side portions, said body member encapsulating a device with electrical circuitry thereon, a plurality of electrically conductive contact members extending from said body member side portions, said circuitry being electrically connected to said contact members;

a support member having a plurality of electrically conductive receptacles substantially corresponding in number to said contact members, said primary circuit package contact members being inserted into said receptacles;

an auxiliary circuit package having a body member with spaced side portions, said auxiliary circuit package body member encapsulating at least one circuit element, said circuit element having electrical characteristics desired to be added to the circuitry in said primary circuit package, a plurality of contact members extending from said side portions of the auxiliary circuit package body member and corresponding to the contact members of said primary circuit package, said circuit element being electrically connected to a selected number of said contact members of said auxiliary circuit package; and said auxiliary circuit package contact members each being inserted into the same receptacles as their corresponding contact members of the primary circuit package with said circuit element being electrically connected with said circuitry in said primary circuit package.

2. The assembly of claim 2 wherein said support member is a printed circuit board.

3. The assembly of claim 2 wherein said receptacles are free standing terminals.

4. An electrical circuit assembly comprising:

a primary circuit package having a body member with spaced side portions, said body member encapsulating a device with electrical circuitry thereon, a plurality of electrically conductive contact members extending from said body member side portions, said circuitry being electrically connected to said contact members;

a printed circuit board having a socket formed of a plurality of spaced free standing terminals substantially corresponding in number to said contact members;

an auxiliary circuit package having a body member with spaced side portions, said auxiliary package body member encapsulating at least one circuit element, said circuit element having electrical characteristics desired to be added to the circuitry in said primary circuit package, a plurality of contact members extending from said side portions of the auxiliary circuit package body member and corresponding to the contact members of said primary circuit package, said circuit element being electrically connected to a selected number of said contact members of the auxiliary circuit package; and said auxiliary circuit package contact members each being inserted into the terminals in the printed circuit board, said primary circuit package being superposed with said auxiliary circuit package with said contact members of the primary circuit package being inserted into the same terminals as their corresponding contact members of the auxiliary circuit package thereby electrically connecting said circuit element with said circuitry in said primary circuit package.

5. An electrical circuit assembly comprising:

a primary circuit package having a body member with spaced side portions, said body member encapsulating a device with electrical circuitry thereon, a plurality of electrically conductive contact members extending from said body member side portions, said contact members extending outwardly and then downwardly in a substantially spaced parallel relationship bounding said body member, said circuitry being electrically connected to said contact members;

a printed circuit board having a socket formed of a plurality of spaced free standing terminals substantially corresponding in number to the contact members of the primary circuit package;

an auxiliary circuit package having a body member with spaced side portions, said auxiliary circuit package body member encapsulating at least one circuit element, said circuit element having electrical characteristics desired to be added to the circuitry in said primary circuit package, a plurality of contact members corresponding to the contact members of said primary circuit package, said auxiliary circuit package contact members extending outwardly from upper portions of said body members side portions and then extending downwardly in a substantially spaced parallel relationship bounding the major portion of said auxiliary circuit package body members, said circuit element being electrically connected to a selected number of said contact members for the auxiliary circuit package;

said downwardly extending portions of said auxiliary circuit package contact members being inserted into said terminals with the major portion of said body member depending between and below upper edges of said terminals; and said primary circuit package being superposed on said auxiliary circuit package with the downwardly extending portions of the primary circuit package contact members being inserted into the same terminals as their corresponding contact members of the auxiliary circuit package thereby electrically connecting said circuit element with the circuitry in said primary circuit package.

6. An electrical circuit assembly comprising:

a primary circuit package having a body member with upper and lower major surfaces and including spaced side portions, said body member encapsulating a device with electrical circuitry thereon, a plurality of electrically conductive contact members extending from said body member side portions, said contact members extending outwardly for a distance and then downwardly in a substantially spaced parallel relationship bounding said body member, said circuitry being electrically connected to said contact members;

a printed circuit board having a socket formed of a plurality of spaced free standing terminals substantially corresponding in number to the contact members of the primary circuit package;

an auxiliary circuit package having a body member with upper and lower major surfaces and including spaced side portions, said auxiliary circuit package body member encapsulating at least one circuit element, said circuit element having electrical characteristics desired to be added to the circuitry in said primary circuit package, a plurality of contact members corresponding to the contact members of said primary circuit package, said auxiliary circuit package contact members extending outwardly for a given distance from upper portions of said body member side portions, said given distance being slightly less than the distance corresponding contact members of said primary circuit package outwardly extend, said contact members of the auxiliary circuit package then extending downwardly in a substantially spaced parallel relationship bounding the major portion of said auxiliary circuit package body member, said circuit element being electrically connected to a selected number of said contact members for the auxiliary circuit package;

said downwardly extending portions of said auxiliary circuit package contact members being inserted into said terminals with the outwardly extending portions of said contact members engaging upper edges of said terminals to support said body member in said socket, the major portion of said auxiliary circuit package body member depending between and below said upper edges of said terminals; and said primary circuit package being superposed on said auxiliary circuit package with the lower surface of said primary circuit package abutting the upper surface of said auxiliary circuit package, said downwardly extending portions of the primary circuit package contact members being inserted into the same terminals as their corresponding contact members of the auxiliary circuit package thereby electrically connecting said circuit element with the circuitry in said primary circuit package.

* * * * *